United States Patent
Chen et al.

(10) Patent No.: US 9,601,164 B2
(45) Date of Patent: Mar. 21, 2017

(54) ARRAY STRUCTURE OF SINGLE-PLOY NONVOLATILE MEMORY

(71) Applicant: eMemory Technology Inc., Hsin-Chu (TW)

(72) Inventors: Wei-Ren Chen, Pingtung County (TW); Wen-Hao Lee, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 0 days.

(21) Appl. No.: 15/257,292

(22) Filed: Sep. 6, 2016

(65) Prior Publication Data

US 2016/0379687 A1    Dec. 29, 2016

Related U.S. Application Data

(62) Division of application No. 14/471,613, filed on Aug. 28, 2014, now Pat. No. 9,508,396.

(60) Provisional application No. 61/973,867, filed on Apr. 2, 2014.

(51) Int. Cl.
| | |
|---|---|
| G11C 16/04 | (2006.01) |
| G11C 5/06 | (2006.01) |
| G11C 17/16 | (2006.01) |
| H01L 23/525 | (2006.01) |
| H01L 27/112 | (2006.01) |
| H01L 27/115 | (2006.01) |

(52) U.S. Cl.
CPC ............ G11C 5/06 (2013.01); G11C 16/0408 (2013.01); G11C 17/16 (2013.01); H01L 23/5252 (2013.01); H01L 27/11206 (2013.01); H01L 27/11526 (2013.01)

(58) Field of Classification Search
CPC ....... G11C 5/06; G11C 17/16; G11C 16/0408; H01L 27/11206; H01L 23/5252; H01L 27/11526
See application file for complete search history.

(56) References Cited

U.S. PATENT DOCUMENTS

| | | |
|---|---|---|
| 6,191,980 B1 | 2/2001 | Kelley et al. |
| 6,326,663 B1 | 12/2001 | Li et al. |
| 6,678,190 B2 | 1/2004 | Yang et al. |
| 7,002,865 B2 | 2/2006 | Agata et al. |
| 7,869,279 B1 | 1/2011 | Ratnakumar |
| 8,077,511 B2 | 12/2011 | Pesavento |
| 8,335,098 B2 | 12/2012 | Shen |
| 8,355,282 B2 | 1/2013 | Ching et al. |

(Continued)

FOREIGN PATENT DOCUMENTS

JP    2010165165    7/2010

OTHER PUBLICATIONS

Japan Patent Office (JPO), Office Action issued May 10, 2016.

*Primary Examiner* — Khamdan Alrobaie
(74) *Attorney, Agent, or Firm* — WPAT, PC; Justin King

(57) ABSTRACT

An array structure of a single-poly nonvolatile memory includes a first MTP section and a first OTP section. The first MTP section includes a plurality of MTP cells and the first OTP section includes a plurality of OTP cells. The first MTP is connected to a first word line, a first source line, a first erase line and a plurality of bit lines. The first OTP section is connected to a second word line, a second source line and the plurality of bit lines shared with the first MTP section.

5 Claims, 9 Drawing Sheets

(56) References Cited

U.S. PATENT DOCUMENTS

| | | |
|---|---|---|
| 8,391,079 B2 | 3/2013 | La Rosa |
| 8,908,412 B2 | 12/2014 | Stiegler et al. |
| 2004/0109380 A1 | 6/2004 | Yang et al. |
| 2005/0030827 A1 | 2/2005 | Gilliland et al. |
| 2007/0217260 A1* | 9/2007 | Kitagawa ............... G11C 7/12 365/185.05 |
| 2008/0056010 A1 | 3/2008 | Horch |
| 2008/0225601 A1 | 9/2008 | Ratnakumar et al. |
| 2011/0299344 A1* | 12/2011 | Peng ................... G11C 17/18 365/189.2 |
| 2013/0208525 A1* | 8/2013 | Peng ................... G11C 17/16 365/96 |
| 2013/0234227 A1 | 9/2013 | Chen et al. |
| 2013/0234228 A1 | 9/2013 | Hsu et al. |

\* cited by examiner

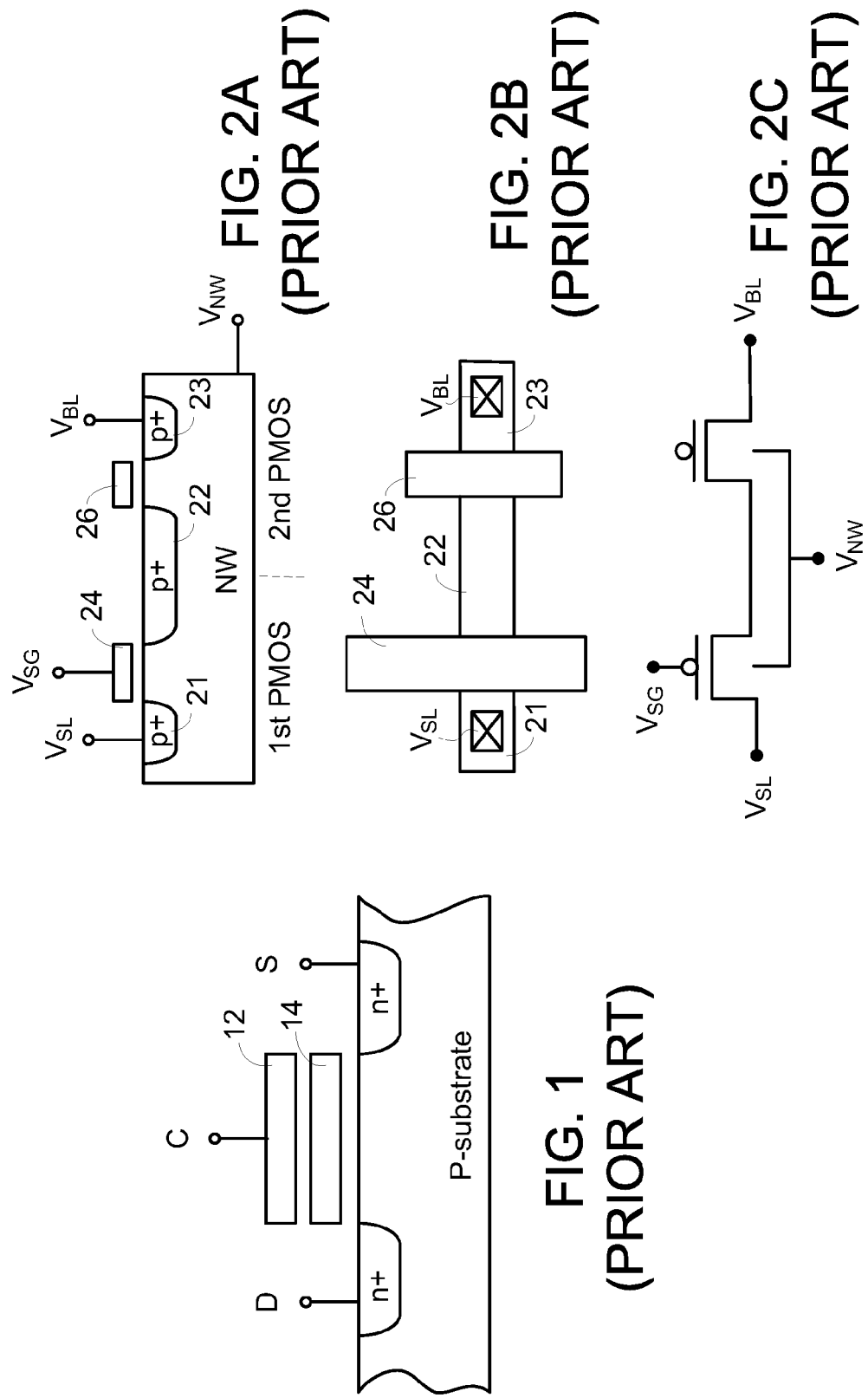

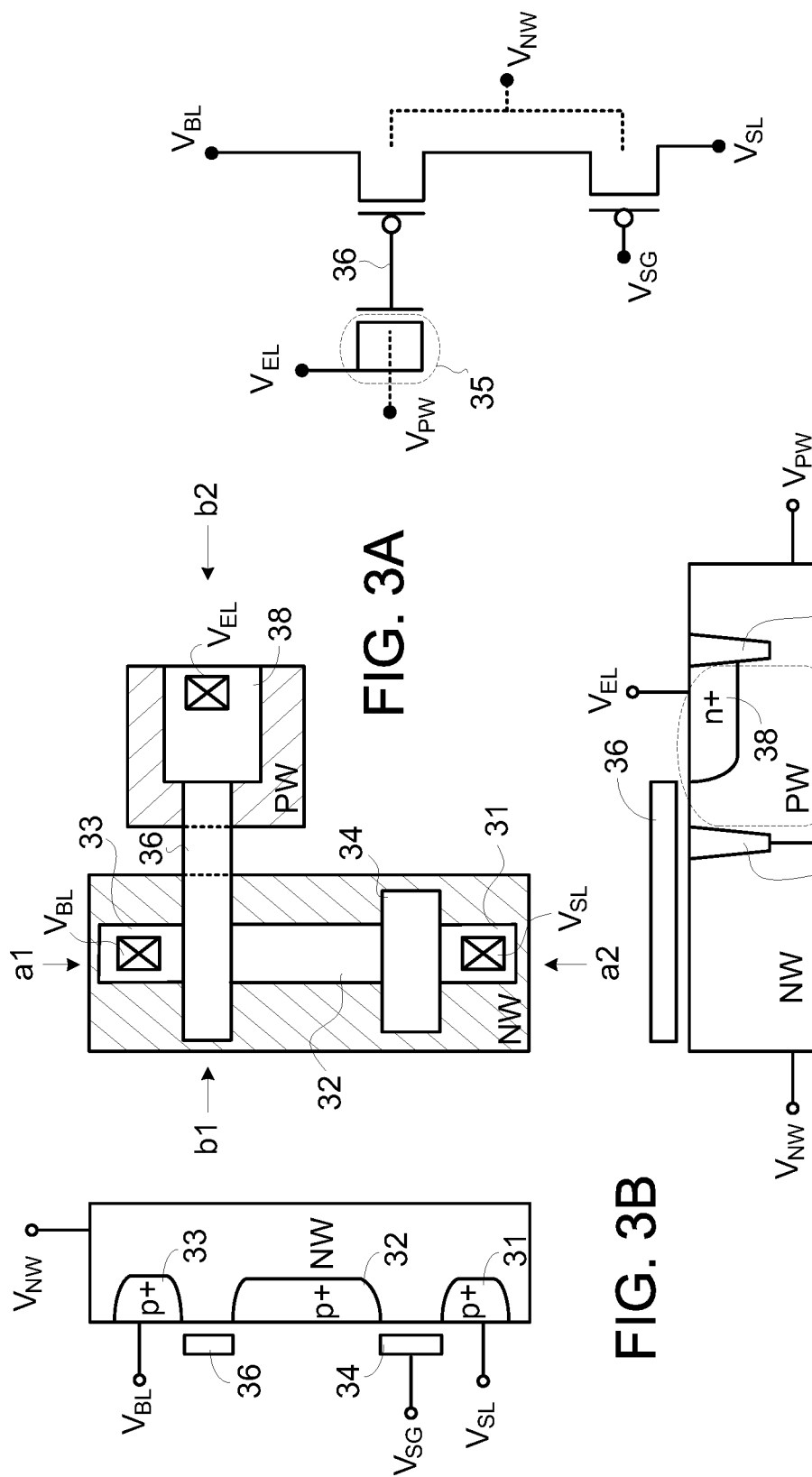

ARRAY STRUCTURE OF SINGLE-PLOY NONVOLATILE MEMORY

This is a divisional application of co-pending application Ser. No. 14/471,613, filed Aug. 28, 2014, which claims the benefit of U.S. provisional patent application No. 61/973,867, filed Apr. 2, 2014, the subject matter of which is incorporated herein by reference.

FIELD OF THE INVENTION

The present invention relates to a nonvolatile memory, and more particularly to an array structure of a single-poly nonvolatile memory.

BACKGROUND OF THE INVENTION

FIG. 1 is a schematic cross-sectional view illustrating a memory cell of a conventional programmable dual-poly nonvolatile memory. The memory cell comprises a floating-gate transistor. As shown in FIG. 1, this floating-gate transistor comprises two stacked and separated gates. The upper gate is a control gate 12, which is connected to a control line C. The lower gate is a floating gate 14. In addition, an n-type doped source region and an n-type doped drain region are constructed in a P-substrate. The n-type doped source region is connected to a source line S. The n-type doped drain region is connected to a drain line D.

For example, in case that the nonvolatile memory is in a programmed state, a high voltage (e.g. +16V) is provided by the drain line D, a ground voltage is provided by the source line S, and a control voltage (e.g. +25V) is provided by the control line C. Consequently, during the process of transmitting the electrons from the source line S to the drain line D through an n-channel region, the hot carriers (e.g. hot electrons) are attracted by the control voltage at the control gate 12 and injected into the floating gate 14. Under this circumstance, a great number of carriers are accumulated in the floating gate 14. Consequently, the programmed state may be considered as a first storage state (e.g. "0" state).

In case that the nonvolatile memory is in a non-programmed state, no carrier is injected into the floating gate 14, and thus the non-programmed state may be considered as a second storage state (e.g. "1" state).

In other words, the characteristic curve of the drain current (id) and the gate-source voltage (Vgs) (i.e. an id-Vgs characteristic curve) in the first storage state and the id-Vgs characteristic curve in the second storage state are distinguished. Consequently, the storage state of the floating-gate transistor may be realized according to the variation of the id-Vgs characteristic curve.

However, since the floating gate 14 and the control gate 12 of the dual-poly nonvolatile memory should be separately produced, the process of fabricating the dual-poly nonvolatile memory needs more steps and is incompatible with the standard CMOS manufacturing process.

Moreover, U.S. Pat. No. 6,678,190 discloses a programmable single-poly nonvolatile memory. FIG. 2A is a schematic cross-sectional view illustrating a memory cell of a conventional programmable single-poly nonvolatile memory disclosed in U.S. Pat. No. 6,678,190. FIG. 2B is a schematic top view illustrating the memory cell of the conventional programmable single-poly nonvolatile memory of FIG. 2A. FIG. 2C is a schematic circuit diagram illustrating the memory cell of the conventional programmable single-poly nonvolatile memory of FIG. 2A.

Please refer to FIGS. 2A-2C. The memory cell of the conventional programmable single-poly nonvolatile memory comprises two serially-connected p-type metal-oxide semiconductor (PMOS) transistors. The first PMOS transistor is used as a select transistor, and a select gate 24 of the first PMOS transistor is connected to a select gate voltage $V_{SG}$. A p-type doped source region 21 is connected to a source line voltage $V_{SL}$. Moreover, a p-type doped drain region 22 may be considered as a combination of a p-type doped drain region of the first PMOS transistor and a first p-type doped region of the second PMOS transistor. A floating gate 26 is disposed over the second PMOS transistor. A second p-type doped region 23 of the second PMOS transistor is connected to a bit line voltage $V_{BL}$. Moreover, these PMOS transistors are constructed in an N-well region (NW). The N-well region is connected to an N-well voltage $V_{NW}$.

By properly controlling the select gate voltage $V_{SG}$, the source line voltage $V_{SL}$, the bit line voltage $V_{BL}$ and the N-well voltage $V_{NW}$, the conventional programmable single-poly nonvolatile memory may be operated in a programmed state or a read state.

Since the two PMOS transistors of the memory cell of the conventional programmable single-poly nonvolatile memory have respective gates 24 and 26, the process of fabricating the conventional programmable single-poly nonvolatile memory is compatible with the standard CMOS manufacturing process.

As described in FIGS. 1 and 2, the memory cell of the nonvolatile memory is only programmable. The electrical property of the nonvolatile memory is only utilized to inject a great number of hot carriers to the floating gate. However, the electrical property fails to be utilized to remove the carriers from the floating gate. That is, for achieving the data-erasing function, the carriers stored in the floating gate may be removed from the floating gate by exposing ultraviolet (UV) light to the nonvolatile memory. Consequently, the memory cell of this nonvolatile memory is referred as a one time programming (OTP) cell.

Therefore, for improving the memory cells of the programmable single-poly nonvolatile memory, there is a need of providing an array structure of multi-times programming (MTP) cells, one time programming (OTP) cells and/or mask read only memory (ROM) cells.

SUMMARY OF THE INVENTION

The present invention provides an array structure of a single-poly nonvolatile memory. The array structure comprises MTP cells, OTP cells and/or ROM cells in a mixed mode.

An embodiment of the present invention provides an array structure of a single-poly nonvolatile memory. The array structure includes a first word line, a first source line, a first erase line, a first bit line, a second bit line, a first memory cell, and a second memory cell. The first memory cell includes a first PMOS transistor, a second PMOS transistor and a first NMOS transistor. A source terminal of the first PMOS transistor is connected to the first source line. A gate terminal of the first PMOS transistor is connected to the first word line. A drain terminal of the first PMOS transistor is connected to a source terminal of the second PMOS transistor. A drain terminal of the second PMOS transistor is connected to the first bit line. A gate terminal of the second PMOS transistor is connected to a gate terminal of the first NMOS transistor. A drain terminal and a source terminal of the first NMOS transistor are connected to the first erase line. The second memory cell includes a third PMOS transistor, a fourth PMOS transistor and a second NMOS transistor. A source terminal of the third PMOS transistor is connected to the first source line. A gate terminal of the third PMOS transistor is connected to the first word line. A drain terminal of the third PMOS transistor is connected to a source terminal of the fourth PMOS transistor. A drain terminal of the fourth PMOS transistor is connected to the second bit line. A gate terminal of the fourth PMOS transistor is connected to a gate terminal of the second NMOS transistor. A drain terminal and a source terminal of the second NMOS transistor are connected to the first erase line. The gate terminal of the second PMOS transistor and the gate terminal of the first NMOS transistor are connected to a first floating gate. The gate terminal of the fourth PMOS transistor and the gate terminal of the second NMOS transistor are connected to a second floating gate.

An embodiment of the present invention provides an array structure of a single-poly nonvolatile memory. The array structure comprising: a first MTP section comprising a first row of MTP cells connected to a first word line, a first source line, a first erase line and a plurality of bit lines; a second MTP section comprising a second row of MTP cells connected to a second word line, a second source line; wherein the second MTP section shared the first erase line and the plurality of bit lines with the first MTP section; and a first OTP section comprising a third row of OTP cells connected to a third word line; wherein the first OTP section shared the first source line and the plurality of bit lines with the first MTP section.

An embodiment of the present invention provides an array structure of a single-poly nonvolatile memory. The array structure comprising: a first MTP section comprising a first row of MTP cells connected to a first word line, a first source line, a first erase line and a plurality of bit lines; a second MTP section comprising a second row of MTP cells connected to a second word line, a second source line; wherein the second MTP section shared the first erase line and the plurality of bit lines with the first MTP section; a first ROM section comprising a third row of ROM cells connected to a third word line; wherein the first ROM section shared the first source line and the plurality of bit lines with the first MTP section; and a second ROM section comprising a fourth row of ROM cells connected to a fourth word line, a third source line, wherein the second ROM section shared the plurality of bit lines with the first MTP section.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 1 (prior art) is a schematic cross-sectional view illustrating a memory cell of a conventional programmable dual-poly nonvolatile memory;

FIG. 2A (prior art) is a schematic cross-sectional view illustrating a memory cell of a conventional programmable single-poly nonvolatile memory disclosed in U.S. Pat. No. 6,678,190;

FIG. 2B (prior art) is a schematic top view illustrating the memory cell of the conventional programmable single-poly nonvolatile memory of FIG. 2A;

FIG. 2C (prior art) is a schematic circuit diagram illustrating the memory cell of the conventional programmable single-poly nonvolatile memory of FIG. 2A;

FIGS. 3A~3D schematically illustrate a memory cell of a single-poly nonvolatile memory according to a first embodiment of the present invention;

DETAILED DESCRIPTION OF PREFERRED EMBODIMENTS

Figures 4A, 4C:
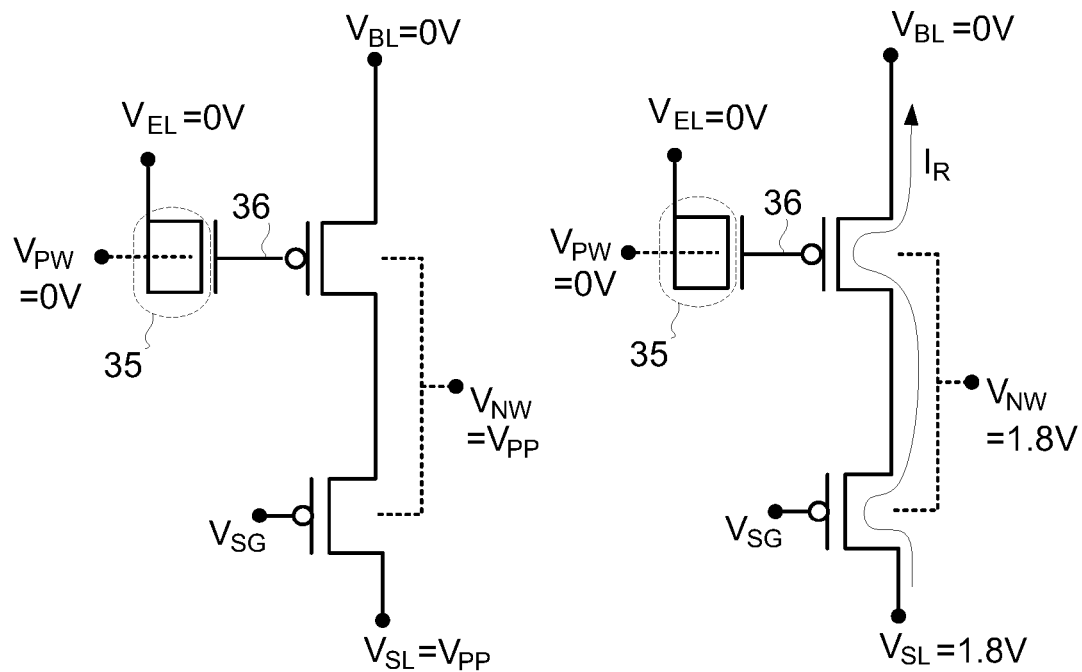
FIGS. 4A~4C schematically and respectively illustrate the bias voltages of the memory cell in a programmed state, an erased state and a read state according to the first embodiment of the present invention.

FIGS. 3A-3D schematically illustrate a memory cell of a single-poly nonvolatile memory according to a first embodiment of the present invention. FIG. 3A is a schematic top view illustrating the memory cell of the single-poly nonvolatile memory according to the first embodiment of the present invention. FIG. 3B is a schematic cross-sectional view illustrating the memory cell of the single-poly nonvolatile memory of FIG. 3A and taken along a first direction (a1-a2). FIG. 3C is a schematic cross-sectional view illustrating the memory cell of the single-poly nonvolatile memory of FIG. 3A and taken along a second direction (b1-b2). FIG. 3D is a schematic equivalent circuit diagram of the memory cell of the single-poly nonvolatile memory according to the first embodiment of the present invention.

As shown in FIGS. 3A and 3B, the memory cell of the first embodiment comprises two serially-connected p-type metal-oxide semiconductor (PMOS) transistors. These two PMOS transistors are constructed in an N-well region (NW). Three p-type doped regions 31, 32 and 33 are formed in the N-well region (NW). In addition, two polysilicon gates 34 and 36 are spanned over the areas between the three p-type doped regions 31, 32 and 33.

The first PMOS transistor is used as a select transistor, and the polysilicon gate 34 (also referred as a select gate) of the first PMOS transistor is connected to a select gate voltage $V_{SG}$. The p-type doped region 31 is a p-type doped source region and connected to a source line voltage $V_{SL}$. The p-type doped region 32 is a p-type doped drain region, which may be considered as a combination of a p-type doped drain region of the first PMOS transistor and a first p-type doped region of the second PMOS transistor. The polysilicon gate 36 (also referred as a floating gate) is disposed over the second PMOS transistor. The p-type doped region 33 is a second p-type doped region of the second PMOS transistor and connected to a bit line voltage $V_{BL}$. Moreover, the N-well region (NW) is connected to an N-well voltage $V_{NW}$. Generally, the select gate 34 of the first PMOS transistor is connected to a word line, and the select gate voltage $V_{SG}$ is a word line control voltage. Moreover, the p-type doped source region 31 is connected to a source line, and the source line voltage $V_{SL}$ is a source line control voltage.

During the ion implantation processes of forming the p-type doped regions 31, 32 and 33, the floating gate 36 and the select gate 34 are used as the implantation mask layers. Consequently, the floating gate 36 and the select gate 34 over the N-well region (NW) are p-type gates.

As shown in FIGS. 3A and 3C, the memory cell of the first embodiment further comprises an n-type metal-oxide semiconductor (NMOS) transistor or a combination of the floating gate 36 and an erase gate region 35. The NMOS transistor is constructed in a P-well region (PW). An n-type doped region 38 is formed in the P-well region (PW). In other words, the erase gate region 35 includes the P-well region (PW) and the n-type doped regions 38. In this embodiment, the first PMOS transistor, the second PMOS transistor and the NMOS transistor are collaboratively defined as a multi-times programming (MTP) cell.

As shown in FIG. 3A, the floating gate 36 is extended to and arranged adjacent to the erase gate region 35. Consequently, the floating gate 36 may be considered as a gate of the NMOS transistor, and the n-type doped region 38 may be considered as a combination of an n-type doped source region and an n-type doped drain region of the NMOS transistor. The n-type doped region 38 is connected to an erase line voltage $V_{EL}$. In addition, the P-well region (PW) is connected to a P-well voltage $V_{PW}$. As shown in FIG. 3C, an isolation structure 39 is formed between the P-well region (PW) and the N-well region (NW). For example, the isolation structure 39 is a shallow trench isolation (STI) structure.

During the ion implantation process of forming the n-type doped region 38, the floating gate 36 is used as the implantation mask layer. Consequently, the floating gate 36 over the erase gate region 35 is an n-type gate.

Figure 4B:
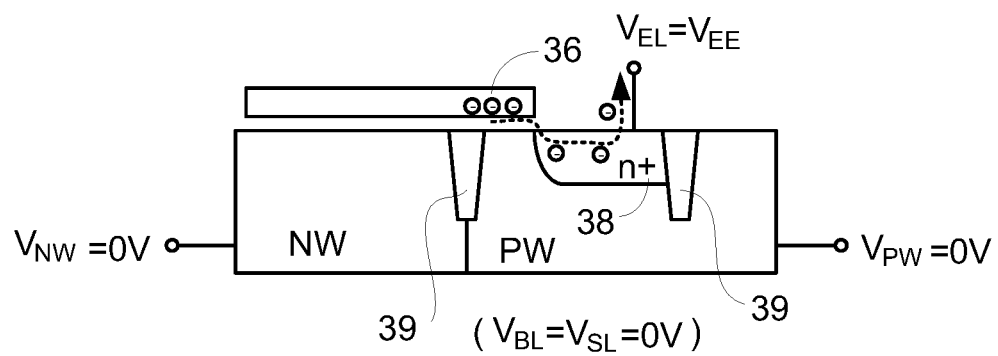

FIGS. 4A~4C schematically and respectively illustrate the bias voltages of the memory cell in a programmed state, an erased state and a read state according to the first embodiment of the present invention.

Please refer to FIG. 4A. In the programmed state, each of the bit line voltage $V_{BL}$, the erase line voltage $V_{EL}$ and the P-well voltage $V_{PW}$ is equal to a ground voltage (0V). Whereas, each of the N-well voltage $V_{NW}$ and the source line voltage $V_{SL}$ is equal to a first positive voltage $V_{pp}$. The first positive voltage $V_{pp}$ is in the range between +3.0V and +9.5V. Consequently, in case that the hot carriers (e.g. electrons) are transmitted through a channel region corresponding to the floating gate 36, the hot carriers are injected into the floating gate 36. Obviously, according to the present invention, the control gate used in the conventional nonvolatile memory for controlling the injection of the hot carriers into the floating gate may be omitted. In addition, the operating principles of the nonvolatile memory of the present invention in the programmed state are similar to those of the conventional nonvolatile memory (see U.S. Pat. No. 6,678,190), and are not redundantly described herein.

Please refer to FIG. 4B. In the erased state, each of the bit line voltage $V_{BL}$, the source line voltage $V_{SL}$, the N-well voltage $V_{NW}$ and the P-well voltage $V_{PW}$ is equal to the ground voltage (0V). Whereas, the erase line voltage $V_{EL}$ is equal to a second positive voltage $V_{EE}$. The second positive voltage $V_{EE}$ is in the range between +6.5V and +18V. As shown in FIG. 4B, if the erase line voltage $V_{EL}$ is equal to the second positive voltage $V_{EE}$, the storage carriers (e.g. electrons) are removed from the floating gate 36 and discharged out through the n-type doped region 38. Consequently, after the erased state, no carrier is stored in the floating gate 36.

Please refer to FIG. 4C. In the read state, the bit line voltage $V_{BL}$ is equal to ground voltage (0V), the source line voltage $V_{SL}$ is equal to 1.8V, the N-well voltage $V_{NW}$ is equal to 1.8V, the erase line voltage $V_{EL}$ is equal to ground voltage (0V), and the P-well voltage $V_{PW}$ is equal to the ground voltage (0V). Depending on whether the hot carriers are stored in the floating gate 36, different magnitudes of the read current $I_R$ are acquired. That is, in the read state, the storage state of the memory cell may be realized according to the read current $I_R$. For example, in the first storage state (e.g. "0" state), the read current $I_R$ is higher than 5 μA. In the second storage state (e.g. "1" state), the read current $I_R$ is lower than 0.1 μA. Furthermore, the above mentioned bias voltages are not limited to the fixed voltages. For example, the bit line voltage $V_{BL}$ can be in the range between 0V to 0.5V, the source line voltage $V_{SL}$ and the N-well voltage $V_{NW}$ can be in the range between $V_{DD}$ and $V_{DD2}$, and the erase line voltage $V_{EL}$ can be in the range between 0V and $V_{DD2}$, wherein the $V_{DD}$ is the core device voltage of the nonvolatile memory and the $V_{DD2}$ is IO device voltage of the nonvolatile memory.

Please refer to FIGS. 3A~3D again. In the memory cell of the first embodiment, the erase gate region is connected to the erase line, and the stored charges are removed from the floating gate 36 by providing an appropriate magnitude of the erase line voltage $V_{EL}$. In other words, if the memory cell of the first embodiment is not connected to the erase line or removed the contact hole of $V_{EL}$, the erasing action cannot be done. Under this circumstance, the memory cell of the first embodiment is referred as a one time programming (OTP) cell.

Figure 5C:
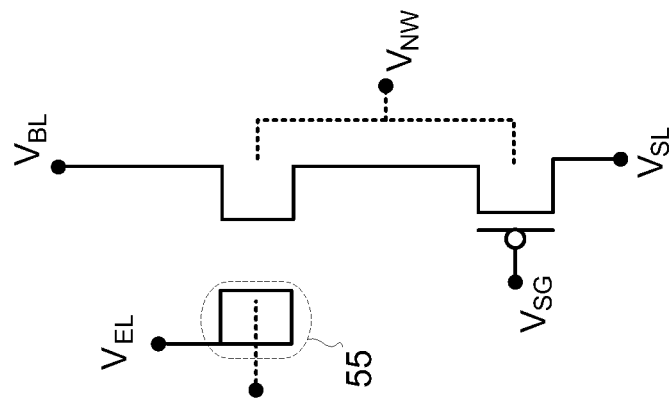
FIGS. 5A~5C schematically illustrate a memory cell of a single-poly nonvolatile memory according to a second embodiment of the present invention.
Figure 5A:
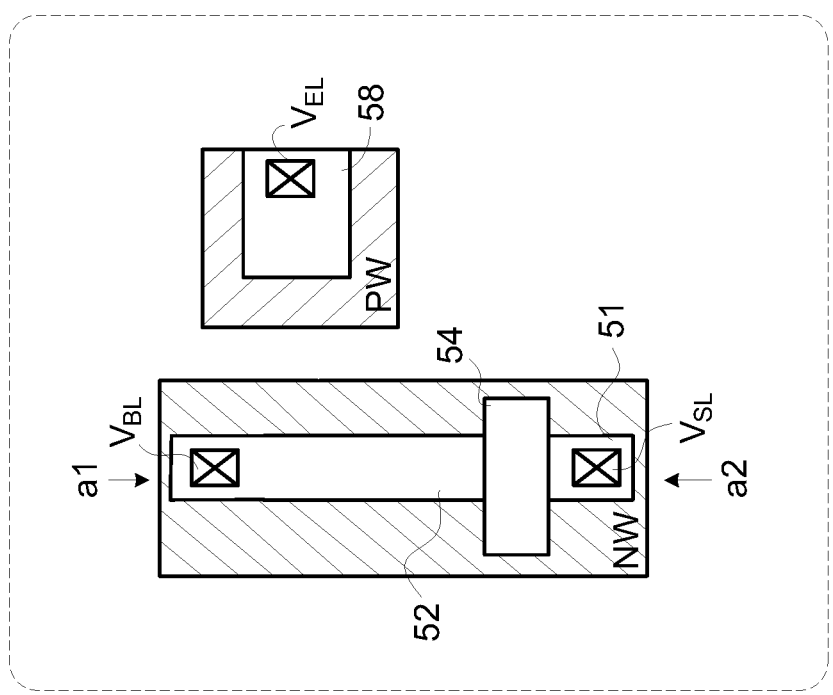
Figure 5B:
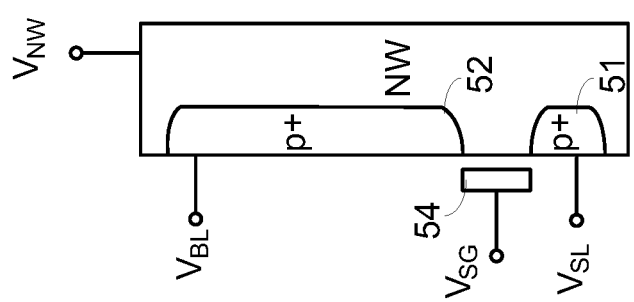

FIGS. 5A~5C schematically illustrate a memory cell of a single-poly nonvolatile memory according to a second embodiment of the present invention. FIG. 5A is a schematic top view illustrating the memory cell of the single-poly nonvolatile memory according to the second embodiment of the present invention. FIG. 5B is a schematic cross-sectional view illustrating the memory cell of the single-poly non-volatile memory of FIG. 5A and taken along a first direction (a1-a2). FIG. 5C is a schematic equivalent circuit diagram of the memory cell of the single-poly nonvolatile memory according to the second embodiment of the present invention.

In comparison with the first embodiment, the memory cell of this embodiment is not equipped with the floating gate. That is, in the case that the procedure of forming the floating gate of the memory cell of the first embodiment is omitted, the memory cell of the second embodiment is manufactured. As shown in FIGS. 5A and 5B, since the memory cell of this embodiment is not equipped with the floating gate, one PMOS transistor is constructed in an N-well region (NW). Two p-type doped regions 51 and 52 are formed in the N-well region (NW). In addition, a polysilicon gate 54 is spanned over the area between the two p-type doped regions 51 and 52.

Generally, the PMOS transistor is used as a select transistor, and the polysilicon gate 54 of the PMOS transistor is connected to a select gate voltage $V_{SG}$. The p-type doped region 51 is a p-type doped source region and connected to a source line voltage $V_{SL}$. The p-type doped region 52 is a p-type doped drain region and connected to a bit line voltage $V_{BL}$. Moreover, the N-well region (NW) is connected to an N-well voltage $V_{NW}$. Generally, the select gate 54 of the PMOS transistor is connected to a word line, and the select gate voltage $V_{SG}$ is a word line control voltage. Moreover, the p-type doped source region 51 is connected to a source line, and the source line voltage $V_{SL}$ is a source line control voltage.

Since the memory cell of this embodiment is not equipped with the floating gate, the n-type doped region 58 in the erase gate region 55 cannot be formed as an NMOS transistor. In addition, the erase gate region 55 and the PMOS transistor are not connected with each other.

Generally, during the process of manufacturing the mask read only memory, the storage states of all memory cells are directly defined. That is, after the mask read only memory (ROM) leaves the factory, the data about the corresponding storage states have been recorded in all ROM cells. The user is only able to read the storage states from the ROM cells, but is unable to program the ROM cells. That is, before the mask read only memory is produced, the user can use MTP cells to test customer's code first and then provide final storage states of the ROM cells to the manufacturer of the mask read only memory. After the mask read only memory is produced, all storage states have been fixed in the ROM cells of the mask read only memory, and cannot be programmed or erased again.

In accordance with the present invention, the memory cell of the first embodiment and the memory cell of the second embodiment may be used as two ROM cells to define "0" and "1" state.

For example, in the read state of the memory cells of the first embodiment and the second embodiment, the bit line voltage $V_{BL}$ is equal to ground voltage (0V), the source line voltage $V_{SL}$ is equal to 1.8V, the N-well voltage $V_{NW}$ is equal to 1.8V, and the P-well voltage $V_{PW}$ is equal to the ground voltage (0V). By providing the select gate voltage $V_{SG}$, the memory cell of the second embodiment generates a higher read current and is considered to have a first storage state (e.g. "0" state); and the memory cell of the first embodiment generates a lower read current and is considered to have a second storage state (e.g. "1" state).

Figure 6:
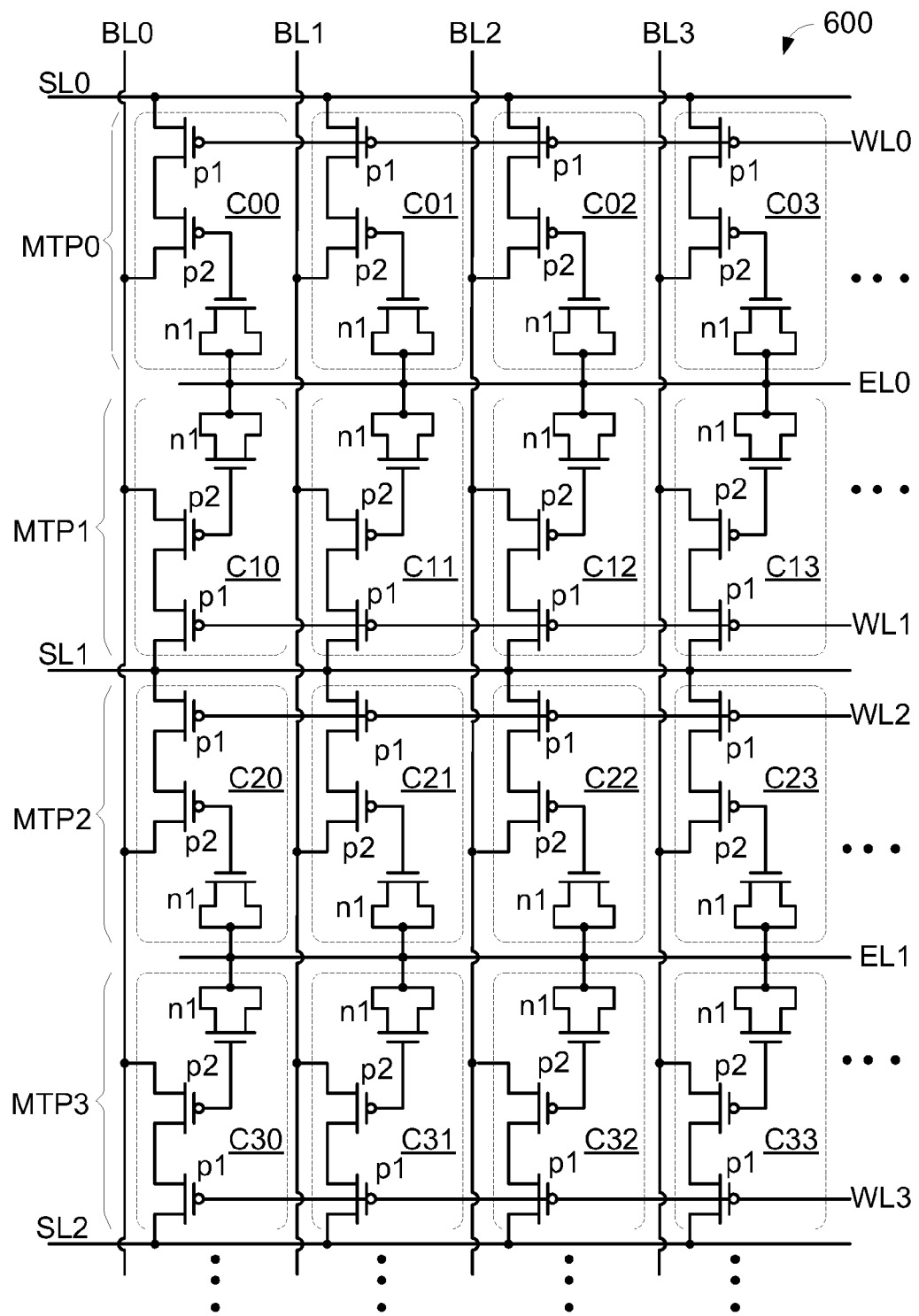
FIG. 6 is a schematic circuit diagram illustrating an array structure of plural MTP cells of a single-poly nonvolatile memory.

FIG. 6 is a schematic circuit diagram illustrating an array structure of plural MTP cells of a single-poly nonvolatile memory. As shown in FIG. 6, the memory cells of the array structure 600 are all MTP cells. The configuration of the MTP cell is identical to that of the first embodiment, and is not redundantly described herein. Moreover, each of the MTP cells comprises a first PMOS transistor p1, a second PMOS transistor p2, and a first NMOS transistor n1.

The gate terminal of the first PMOS transistor p1 is connected to a word line, and the source terminal of the first PMOS transistor p1 is connected to a source line. The drain terminal of the second PMOS transistor p2 is connected to a bit line, and the source terminal of the second PMOS transistor p2 is connected to the drain terminal of the first PMOS transistor p1. The gate terminal of the first NMOS transistor n1 is connected to the gate terminal of the second PMOS transistor p2, and the drain terminal and the source terminal of the first NMOS transistor n1 are connected to an erase line. Moreover, the gate of the second PMOS transistor p2 and the gate of the first NMOS transistor n1 are the same floating gate. In addition, the drain terminal and the source terminal of the first NMOS transistor n1 are formed in the erase gate region. The same with the first embodiment, the two PMOS transistors p1 and p2 should be constructed in an N-well region (NW), which is connected to an N-well voltage $V_{NW}$ (not shown in FIG. 6); and the N-well voltage $V_{NW}$ may be equal to the source line voltage $V_{SL}$.

For clarification and brevity, the memory cells of the array structure 600 in four columns and four rows are shown in the drawing. For example, the MTP0 section comprises memory cells C00~C03, the MTP1 section comprises memory cells C10~C13, the MTP2 section comprises memory cells C20~C23, and the MTP3 section comprises memory cells C30~C33. The memory cells C00~C03 of the MTP0 section are all connected to the word line WL0, the source line SL0 and the erase line EL0. The memory cell C00 is connected to the bit line BL0, the memory cell C01 is connected to the bit line BL1, the memory cell C02 is connected to the bit line BL2, and the memory cell C03 is connected to the bit line BL3. The connection relationships of the memory cells C10~C13, C20~C23 and C30~C33 of the MTP1, MTP2 and MTP3 sections are similar to those of the memory cells C00~C03 of the MTP0 section, and are not redundantly described herein.

According to the array structure 600 of FIG. 6, the MTP0 section comprises a row of C00~C03 MTP cells, which may be programmed, read or erased by a controlling circuit (not shown) through the word line WL0, the source line SL0, the erase line EL0 and the bit lines BL0~BL3. Similarly, other memory cells of the array structure 600 may be programmed, read or erased by the controlling circuit through corresponding signal lines.

Moreover, in the case that the memory cell of the first embodiment is not connected to the erase line, the memory cell may be considered as a one time programming (OTP) cell. Furthermore, the present invention may provide an array structure of plural OTP cells and plural MTP cells in a mixed mode.

Figure 7A:
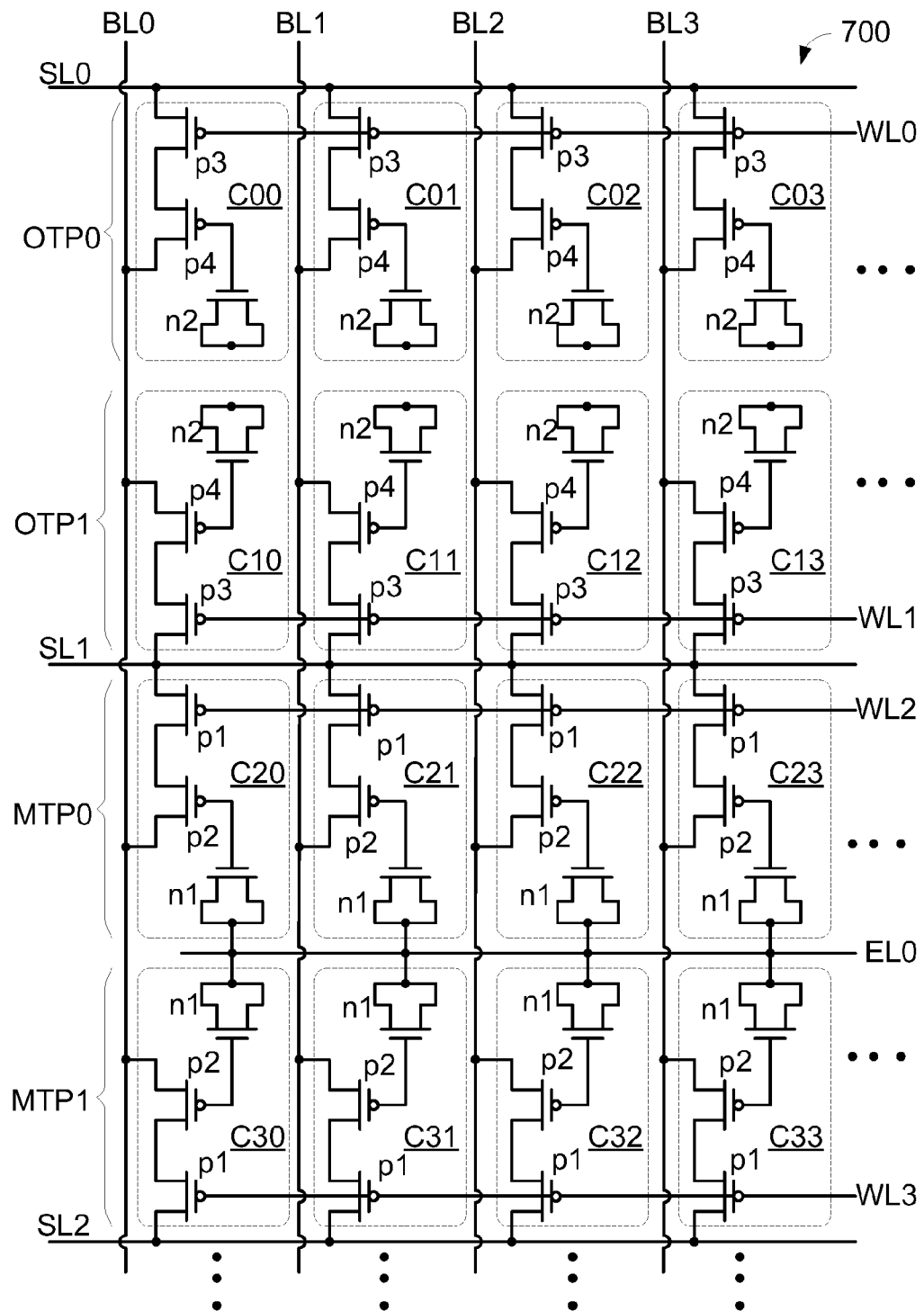
FIG. 7A is a schematic circuit diagram illustrating an array structure of plural OTP cells and plural MTP cells of a single-poly nonvolatile memory in a mixed mode.

FIG. 7A is a schematic circuit diagram illustrating an array structure of plural OTP cells and plural MTP cells of a single-poly nonvolatile memory in a mixed mode. As shown in FIG. 7A, the array structure 700 comprises plural OTP cells and plural MTP cells. Each of the MTP cells comprises a first PMOS transistor p1, a second PMOS transistor p2, and a first NMOS transistor n1. Each of the OTP cells comprises a third PMOS transistor p3, a fourth PMOS transistor p4, and a second NMOS transistor n2.

The gate terminal of the first PMOS transistor p1 is connected to a word line, and the source terminal of the first PMOS transistor p1 is connected to a source line. The drain terminal of the second PMOS transistor p2 is connected to a bit line, and the source terminal of the second PMOS transistor p2 is connected to the drain terminal of the first PMOS transistor p1. The gate terminal of the first NMOS transistor n1 is connected to the gate terminal of the second PMOS transistor p2, and the drain terminal and the source terminal of the first NMOS transistor n1 are connected to an erase line. Moreover, the gate of the second PMOS transistor p2 and the gate of the first NMOS transistor n1 are the same floating gate. In addition, the drain terminal and the source terminal of the first NMOS transistor n1 are formed in the erase gate region. The same, the PMOS transistors p1, p2, p3 and p4 should be constructed in an N-well region (NW), which is connected to an N-well voltage $V_{NW}$ (not shown in FIG. 7A); and the N-well voltage $V_{NW}$ may be equal to the source line voltage $V_{SL}$.

For clarification and brevity, the memory cells of the array structure 700 in four columns and four rows are shown in the drawing, and the array structure 700 is divided into two MTP sections and two OTP sections. For example, the OTP0 section comprises memory cells C00~C03, the OTP1 section comprises memory cells C10~C13, the MTP0 section comprises memory cells C20~C23, and the MTP1 section comprises memory cells C30~C33.

The memory cells C20~C23 of the MTP0 section are all connected to the word line WL2, the source line SL1 and the erase line EL0. The memory cell C20 is connected to the bit line BL0, the memory cell C21 is connected to the bit line BL1, the memory cell C22 is connected to the bit line BL2, and the memory cell C23 is connected to the bit line BL3. The connection relationships of the memory cells C30~C33 of the MTP1 section are similar to those of the memory cells C20~C23 of the MTP0 section, and are not redundantly described herein.

The gate terminal of the third PMOS transistor p3 is connected to a word line, and the source terminal of the third PMOS transistor p3 is connected to a source line. The drain terminal of the fourth PMOS transistor p4 is connected to a bit line, and the source terminal of the fourth PMOS transistor p4 is connected to the drain terminal of the third PMOS transistor p3. The gate terminal of the second NMOS transistor n2 is connected to the gate terminal of the fourth PMOS transistor p4, and the drain terminal and the source terminal of the second NMOS transistor n2 are in a floating state. Moreover, the gate of the fourth PMOS transistor p4 and the gate of the second NMOS transistor n2 are the same floating gate. In addition, the drain terminal and the source terminal of the second NMOS transistor n2 are formed in the erase gate region.

The memory cells C00~C03 of the OTP0 section are all connected to the word line WL0 and the source line SL0. The memory cell C00 is connected to the bit line BL0, the memory cell C01 is connected to the bit line BL1, the memory cell C02 is connected to the bit line BL2, and the memory cell C03 is connected to the bit line BL3. The connection relationships of the memory cells C10~C13 of the OTP1 section are similar to those of the memory cells C00~C03 of the OTP0 section, and are not redundantly described herein.

According to the array structure 700 of FIG. 7A, the MTP0 section comprises a row of C20~C23 MTP cells, which may be programmed, read or erased by a controlling circuit (not shown) through the word line WL2, the source line SL1, the erase line EL0 and the bit lines BL0~BL3. Similarly, the memory cells C30~C33 of the MTP1 section of the array structure 700 may be programmed, read or erased by the controlling circuit through corresponding signal lines.

Moreover, the OTP0 section comprises a row of C00~C03 OTP cells and the OTP1 section comprises a row of C10~C13 OTP cells. All the OTP cells are not connected to the erase line. Consequently, the memory cells C00~C03 of the OTP0 section may be programmed once or read by a controlling circuit (not shown) through the word line WL0, the source line SL0 and the bit lines BL0~BL3. Similarly, the memory cells C10~C13 of the OTP1 section of the array structure 700 may be programmed once or read by the controlling circuit through corresponding signal lines.

From the above descriptions, if some memory cells are not connected to the erase line during the process of manufacturing the array structure of the single-poly nonvolatile memory, the array structure of plural OTP cells and plural MTP cells in the mixed mode can be manufactured.

Moreover, since the OTP cell is not connected to the erase line, the procedure of forming the erase gate region may be omitted. Moreover, during the procedures of forming the OTP0 section and the OTP1 section of the array structure in the mixed mode, the erase gate regions of are omitted and thus the NMOS transistors are not produced. Under this circumstance, the overall size of the array structure can be further reduced.

Figure 7B:
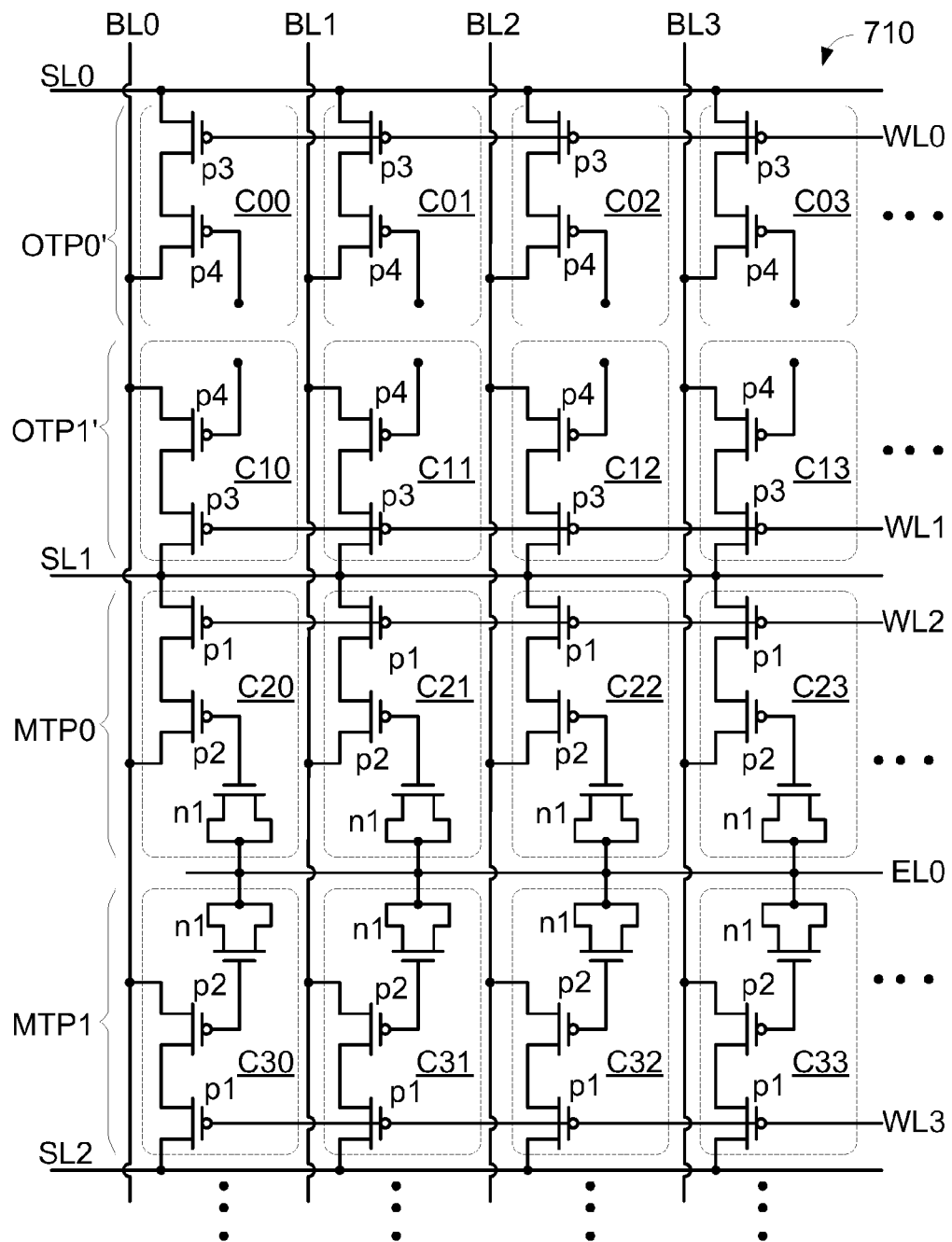
FIG. 7B is a schematic circuit diagram illustrating another array structure of plural OTP cells and plural MTP cells of a single-poly nonvolatile memory in a mixed mode.

FIG. 7B is a schematic circuit diagram illustrating another array structure of plural OTP cells and plural MTP cells of a single-poly nonvolatile memory in a mixed mode. As shown in FIG. 7B, the array structure 710 comprises plural OTP cells and plural MTP cells. Each of the MTP cells comprises a first PMOS transistor p1, a second PMOS transistor p2, and a first NMOS transistor n1. Each of the OTP cells comprises a third PMOS transistor p3 and a fourth PMOS transistor p4. Since the OTP cells are not equipped with the second NMOS transistors, the overall size of the array structure can be effectively reduced. The connection relationships of the memory cells C20~C23 of the MTP0 section and the memory cells C30~C33 of the MTP1 section are similar to those of FIG. 7A, and are not redundantly described herein. Furthermore, the PMOS transistors p1, p2, p3 and p4 should be constructed in an N-well region (NW), which is connected to an N-well voltage $V_{NW}$ (not shown in FIG. 7B); and the N-well voltage $V_{NW}$ may be equal to the source line voltage $V_{SL}$.

The gate terminal of the third PMOS transistor p3 is connected to a word line, and the source terminal of the third PMOS transistor p3 is connected to a source line. The drain terminal of the fourth PMOS transistor p4 is connected to a bit line, and the source terminal of the fourth PMOS transistor p4 is connected to the drain terminal of the third PMOS transistor p3. The gate terminal of the fourth PMOS transistor p4 is in a floating state. That is, the gate of the fourth PMOS transistor p4 is a floating gate.

The memory cells C00~C03 of the OTP0' section are all connected to the word line WL0 and the source line SL0. The memory cell C00 is connected to the bit line BL0, the memory cell C01 is connected to the bit line BL1, the memory cell C02 is connected to the bit line BL2, and the memory cell C03 is connected to the bit line BL3. The connection relationships of the memory cells C10~C13 of the OTP1' section are similar to those of the memory cells C00~C03 of the OTP0' section, and are not redundantly described herein.

According to the array structure 710 of FIG. 7B, the MTP0 section comprises a row of C20~C23 MTP cells and the MTP1 section comprises a row of C30~C33 MTP cells. All the MTP cells may be programmed, read or erased by a controlling circuit (not shown) through corresponding signal lines. Moreover, the OTP0' section comprises C00~C03 OTP cells and the OTP1' section comprises C10~C13 OTP cells. All the OTP cells may be programmed once or read by a controlling circuit (not shown) through corresponding signal lines.

Moreover, the erase gate regions of the memory cells C00~C03 of the OTP0' section and the memory cells C10~C13 of the OTP1' section are removed compared to the memory cells C20~C33 of the MTP0 and MTP1 sections. Consequently, the memory cells C00~C03 of the OTP0' section may be programmed once or read by a controlling circuit (not shown) through the word line WL0, the source line SL0 and the bit lines BL0~BL3. Similarly, the memory cells C10~C13 of the OTP1' section of the array structure 710 may be programmed once or read by the controlling circuit through corresponding signal lines.

As mentioned above, the memory cell of the second embodiment is not equipped with the floating gate when compared with the memory cell of the first embodiment.

Furthermore, the present invention may provide an array structure of plural ROM cells and plural MTP cells in a mixed mode.

Figure 8:
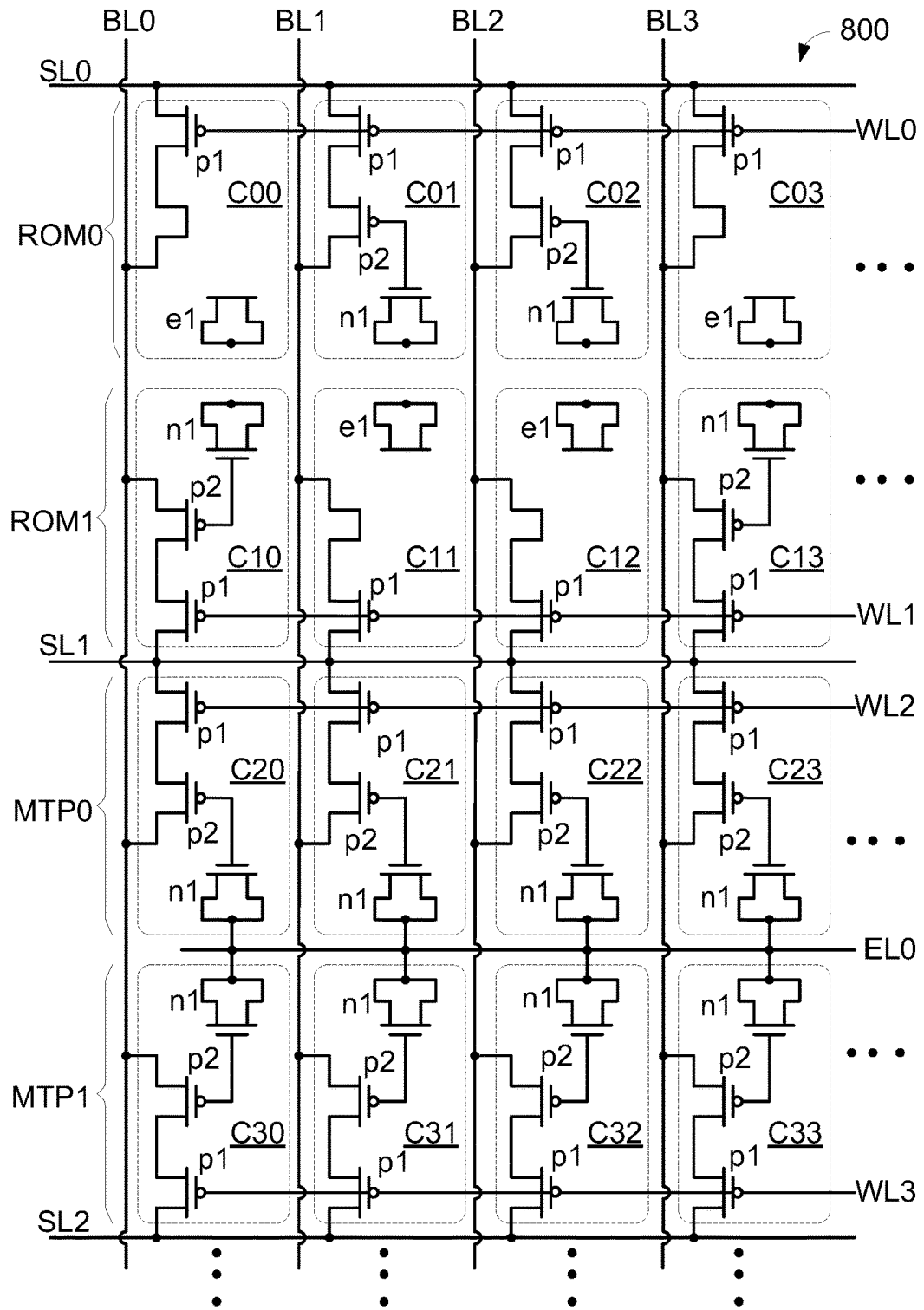
FIG. 8 is a schematic circuit diagram illustrating an array structure of plural ROM cells and plural MTP cells of a single-poly nonvolatile memory in a mixed mode.

FIG. 8 is a schematic circuit diagram illustrating an array structure of plural ROM cells and plural MTP cells of a single-poly nonvolatile memory in a mixed mode. As shown in FIG. 8, the array structure 800 comprises plural ROM cells and plural MTP cells. For clarification and brevity, the memory cells of the array structure 800 in four columns and four rows are shown in the drawing. For example, the ROM0 section comprises memory cells C00~C03, the ROM1 section comprises memory cells C10~C13, the MTP0 section comprises memory cells C20~C23, and the MTP1 section comprises memory cells C30~C33.

Each of the memory cells of the MTP0 section and the MTP1 section comprises a first PMOS transistor p1, a second PMOS transistor p2, and a first NMOS transistor n1. In the ROM0 section and the ROM1 section, the memory cell in the first storage state comprises a first PMOS transistor p1 and an erase gate region e1, and the memory cell in the second storage state comprises a first PMOS transistor p1, a second PMOS transistor p2, and a first NMOS transistor n1. The connection relationships of the memory cells C20~C23 of the MTP0 section and the memory cells C30~C33 of the MTP1 section are similar to those of FIG. 7A, and are not redundantly described herein. Furthermore, the PMOS transistors p1 and p2 should be constructed in an N-well region (NW), which is connected to an N-well voltage $V_{NW}$ (not shown in FIG. 8); and the N-well voltage $V_{NW}$ may be equal to the source line voltage $V_{SL}$.

In the ROM0 section, the memory cell C00 is in the first storage state (e.g. "0" state), the memory cell C01 is in the second storage state (e.g. "1" state), the memory cell C02 is in the second storage state (e.g. "1" state), and the memory cell C03 is in the first storage state (e.g. "0" state). Consequently, during the process of manufacturing the array structure 800, the procedures of forming the floating gates of the memory cells C00 and C03 are omitted. That is, the memory cells C00 and C03 are the memory cells of the second embodiment, and the memory cells C01 and C02 are the memory cells of the first embodiment. The storage states of the memory cells of the ROM1 section are similar to those of the ROM0 section, and are not redundantly described herein.

Moreover, the memory cells C00~C03 of the ROM0 section are all connected to the word line WL0 and the source line SL0. The drain terminals of the first PMOS transistors p1 of the memory cells C00 and C03 are connected to the bit lines BL0 and BL3, respectively. The drain terminals of the second PMOS transistors p2 of the memory cells C01 and C02 are connected to the bit lines BL1 and BL2, respectively. Moreover, the drain terminal and the source terminals of the first NMOS transistors n1 of the memory cells C01 and C02 are in the floating state, and the erase gate regions e1 of the memory cells C00 and C03 are also in the floating state. Alternatively, in another embodiment, the procedures of forming the erase gate regions e1 and the first NMOS transistors n1 of the memory cells of the ROM0 section and the ROM1 section may be omitted. Consequently, the overall size of the array structure is reduced.

According to the array structure 800 of FIG. 8, the MTP0 section comprises a row of C20~C23 MTP cells, which may be programmed, read or erased by a controlling circuit (not shown) through the word line WL2, the source line SL1, the erase line EL0 and the bit lines BL0~BL3. Similarly, the memory cells C30~C33 of the MTP1 section of the array structure 800 may be programmed, read or erased by the controlling circuit through corresponding signal lines.

Moreover, the ROM0 section comprises a row of C00~C03 cells, which may be read by a controlling circuit (not shown) through the word line WL0, the source line SL0 and the bit lines BL0~BL3. Consequently, the controlling circuit realizes that the memory cell C00 is in the first storage state, the memory cell C01 is in the second storage state, the memory cell C02 is in the second storage state and the memory cell C03 is in the first storage state. Similarly, the memory cells C10~C13 of the ROM1 section of the array structure 800 may be read by the controlling circuit through corresponding signal lines.

From the above descriptions, if some memory cells are not equipped with the floating gates during the process of manufacturing the array structure of the single-poly nonvolatile memory, the array structure of plural ROM cells and plural MTP cells in the mixed mode can be manufactured.

Moreover, the concepts of FIGS. 7A and 8 may be expanded to manufacture an array structure of plural ROM cells, plural OTP cells and plural MTP cells of a single-poly nonvolatile memory in a mixed mode.

Figure 9:
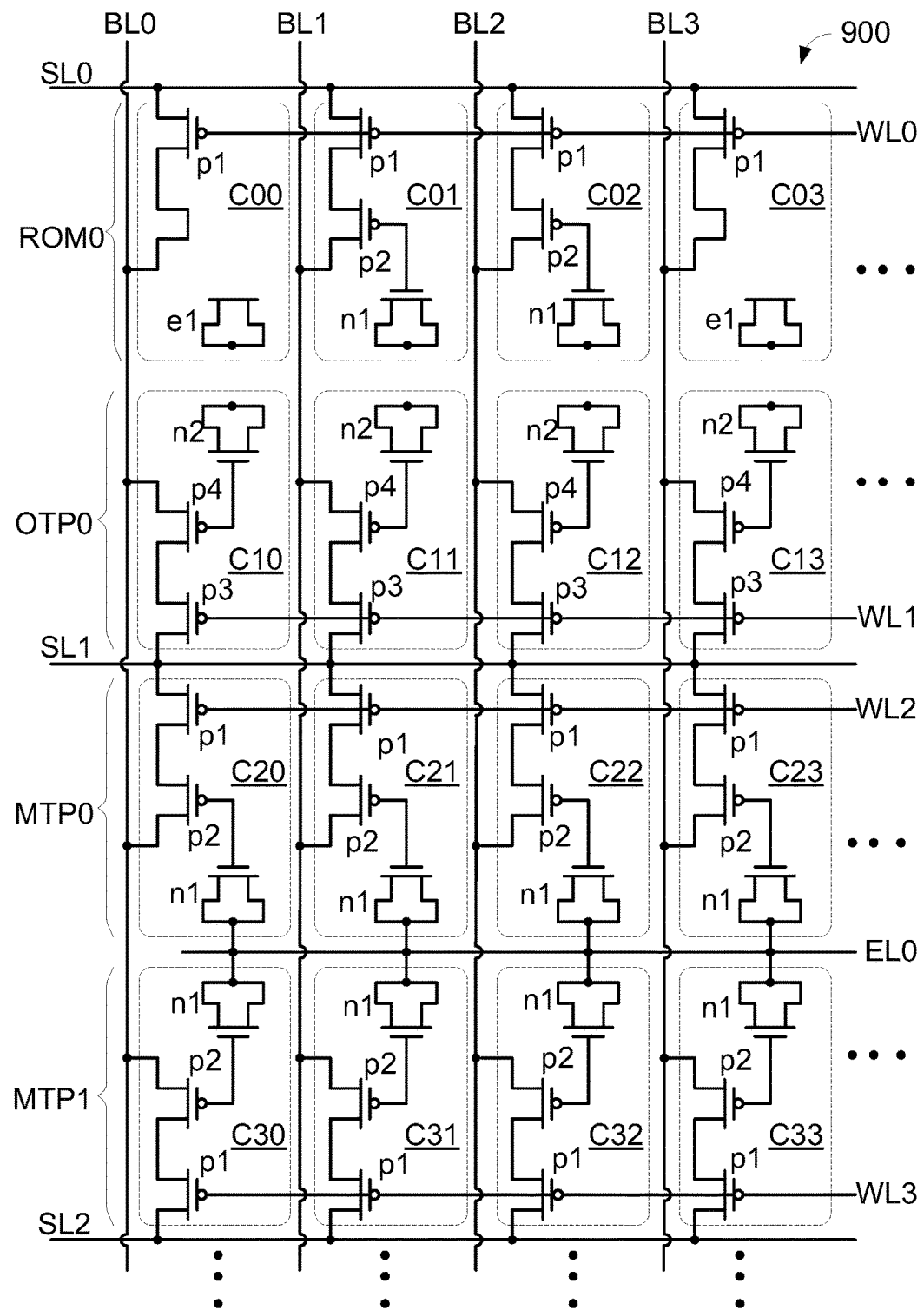
FIG. 9 is a schematic circuit diagram illustrating an array structure of plural ROM cells, plural OTP cells and plural MTP cells of a single-poly nonvolatile memory in a mixed mode.

FIG. 9 is a schematic circuit diagram illustrating an array structure of plural ROM cells, plural OTP cells and plural MTP cells of a single-poly nonvolatile memory in a mixed mode. As shown in FIG. 9, the array structure 900 is divided into a ROM0 section, an OTP0 section, a MTP0 section and a MTP1 section. The memory cells of the MTP0 section and the MTP1 section may be programmed, read or erased by a controlling circuit (not shown). The memory cells of the OTP0 section may be programmed or read by the controlling circuit. The memory cells of ROM0 may be read by the controlling circuit. The connection relationships of the memory cells will not be redundantly described herein. The same, the PMOS transistors p1, p2, p3 and p4 should be constructed in an N-well region (NW), which is connected to an N-well voltage $V_{NW}$ (not shown in FIG. 9); and the N-well voltage $V_{NW}$ may be equal to the source line voltage $V_{SL}$.

Moreover, the operating voltages of the signal lines corresponding to the MTP section, the OTP section and the ROM section are listed in the following table.

|  |  | SL/NW | WL | BL | EL |
|---|---|---|---|---|---|
| MTP/OTP/ROM | Read | $V_{DD}$ | 0 V | 0 V | 0 V/X/X |
| MTP/OTP | Program | $V_{PP}$ | 0 V | 0 V | 0 V/X |
| MTP | Erase | 0 V | 0 V | 0 V | $V_{EE}$ |

For example, the voltage VDD is 1.8V, the voltage $V_{pp}$ is in the range between +3.0V and +9.5V, and the voltage $V_{EE}$ is in the range between +6.5V and +18V. It is noted that the above operating voltages are presented herein for purpose of illustration and description only.

From the above descriptions, the present invention provides an array structure of a single-poly nonvolatile memory. The procedures of fabricating the memory cells are compatible with the standard CMOS manufacturing process. Consequently, the array structure may be designed to have a mixed mode; the array structure may comprise plural MTP cells in an array.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An array structure of a single-poly nonvolatile memory, the array structure comprising:
   a first word line;
   a second word line;
   a first source line;
   a second source line;
   a first erase line;
   a first bit line;
   a second bit line;
   a first MTP cell comprising a first PMOS transistor, a second PMOS transistor and a first NMOS transistor, wherein a source terminal of the first PMOS transistor is connected to the first source line, a gate terminal of the first PMOS transistor is connected to the first word line, a drain terminal of the first PMOS transistor is connected to a source terminal of the second PMOS transistor, a drain terminal of the second PMOS transistor is connected to the first bit line, a gate terminal of the second PMOS transistor is connected to a gate terminal of the first NMOS transistor, and a drain terminal and a source terminal of the first NMOS transistor are connected to the first erase line; and
   a first OTP cell comprising a third PMOS transistor and a fourth PMOS transistor, wherein a source terminal of the third PMOS transistor is connected to the second source line, a gate terminal of the third PMOS transistor is connected to the second word line, a drain terminal of the third PMOS transistor is connected to a source terminal of the fourth PMOS transistor, a drain terminal of the fourth PMOS transistor is connected to the second bit line, and a gate terminal of the fourth PMOS transistor is a floating state.

2. The array structure as claimed in claim 1, further comprising:
   a third source line;
   a third bit line;
   a third word line; and
   a second MTP cell comprising a fifth PMOS transistor, a sixth PMOS transistor and a second NMOS transistor, wherein a source terminal of the fifth PMOS transistor is connected to the third source line, a gate terminal of the fifth PMOS transistor is connected to the third word line, a drain terminal of the fifth PMOS transistor is connected to a source terminal of the sixth PMOS transistor, a drain terminal of the sixth PMOS transistor is connected to the third bit line, a gate terminal of the sixth PMOS transistor is connected to a gate terminal of the second NMOS transistor, and a drain terminal and a source terminal of the second NMOS transistor are connected to the first erase line.

3. The array structure as claimed in claim 2, further comprising:
   a fourth bit line;
   a fourth word line; and
   a second OTP cell comprising a seventh PMOS transistor and an eighth PMOS transistor, wherein a source terminal of the seventh PMOS transistor is connected to the third source line, a gate terminal of the seventh PMOS transistor is connected to the fourth word line, a drain terminal of the seventh PMOS transistor is connected to a source terminal of the eighth PMOS transistor, a drain terminal of the eighth PMOS transistor is connected to the fourth bit line, and a gate terminal of the eighth PMOS transistor is the floating state.

4. The array structure as claimed in claim 3, further comprising:
   a third MTP cell comprising a ninth PMOS transistor, a tenth PMOS transistor and a third NMOS transistor, wherein a source terminal of the ninth PMOS transistor is connected to the third source line, a gate terminal of the ninth PMOS transistor is connected to the third word line, a drain terminal of the ninth PMOS transistor is connected to a source terminal of the tenth PMOS transistor, a drain terminal of the tenth PMOS transistor is connected to the first bit line, a gate terminal of the tenth PMOS transistor is connected to a gate terminal of the third NMOS transistor, and a drain terminal and a source terminal of the third NMOS transistor are connected to the first erase line.

5. The array structure as claimed in claim 3, further comprising:
   a third OTP cell comprising an eleventh PMOS transistor and a twelfth PMOS transistor, wherein a source terminal of the eleventh PMOS transistor is connected to the third source line, a gate terminal of the eleventh PMOS transistor is connected to the fourth word line, a drain terminal of the eleventh PMOS transistor is connected to a source terminal of the twelfth PMOS transistor, a drain terminal of the twelfth PMOS transistor is connected to the second bit line, and a gate terminal of the twelfth PMOS transistor is the floating state.

* * * * *